United States Patent
Hagihara et al.

(10) Patent No.: US 8,421,665 B2
(45) Date of Patent: Apr. 16, 2013

(54) A/D CONVERSION CIRCUIT INCLUDING A PULSE TRANSIT CIRCUIT

(75) Inventors: Yoshio Hagihara, Tokyo (JP); Yasunari Harada, Ebina (JP)

(73) Assignees: Olympus Corporation, Tokyo (JP); Denso Corporation, Kariya-shi, Aichi (JP)

( * ) Notice: Subject to any disclaimer, the term of this patent is extended or adjusted under 35 U.S.C. 154(b) by 30 days.

(21) Appl. No.: 12/991,275

(22) PCT Filed: May 7, 2009

(86) PCT No.: PCT/JP2009/058647
§ 371 (c)(1),
(2), (4) Date: Nov. 5, 2010

(87) PCT Pub. No.: WO2009/136627
PCT Pub. Date: Nov. 12, 2009

(65) Prior Publication Data
US 2011/0090108 A1   Apr. 21, 2011

(30) Foreign Application Priority Data
May 7, 2008   (JP) .................................. 2008-121208

(51) Int. Cl.
*H03M 1/50* (2006.01)
(52) U.S. Cl.
USPC .......................................... 341/166; 341/155
(58) Field of Classification Search .................. 341/157, 341/155, 166; 375/360; 327/160, 161
See application file for complete search history.

(56) References Cited

U.S. PATENT DOCUMENTS

| | | | |
|---|---|---|---|
| 5,396,247 A | | 3/1995 | Watanabe et al. |
| 5,999,586 A | * | 12/1999 | Terada et al. ................. 377/20 |

(Continued)

FOREIGN PATENT DOCUMENTS

| | | |
|---|---|---|
| CN | 1628419 A | 6/2005 |
| JP | 5-259907 A | 10/1993 |

(Continued)

OTHER PUBLICATIONS

Watanabe, T. et al. "An All-Digital Analog-to-Digital Converter With 12μ-V/LSB Using Moving-Average Filtering," IEEE Journal of Solid-State Circuits, Jan. 2003, vol. 38, No. 1, pp. 120-125.

(Continued)

*Primary Examiner* — Peguy Jean Pierre
(74) *Attorney, Agent, or Firm* — Westerman, Hattori, Daniels & Adrian, LLP

(57) ABSTRACT

An A/D conversion circuit includes: a pulse transit circuit into which either a power supply or current source and also a pulse signal is input, and through which the pulse signal transits; a transit position detection section that detects a transit position of the pulse signal within the pulse transit circuit, and outputs data in accordance with the transit position; and a digital data creation section that, based on the data output by the transit position detection section, creates digital data that corresponds to the size of the power supply or current source. The pulse transit circuit is formed by a plurality of inverter circuits that are joined together in series, and the plurality of inverter circuits are formed by identical logical elements in which delay times between input signals and output signals change in accordance with the size of the power supply or current source. In the pulse transit circuit, a start-up signal that causes the transiting of the pulse signal to commence is input into one of the plurality of inverter circuits, and the transit position detection section detects the transit position of the pulse signal within the pulse transit circuit based on the output signals from each one of the plurality of inverter circuits.

4 Claims, 14 Drawing Sheets

U.S. PATENT DOCUMENTS

| | | | |
|---|---|---|---|
| 6,100,768 A * | 8/2000 | Hirayama | 331/57 |
| 6,252,467 B1 | 6/2001 | Yoshimura | |
| 7,248,197 B2 * | 7/2007 | Watanabe | 341/157 |
| 7,864,093 B2 * | 1/2011 | Oba | 341/157 |

FOREIGN PATENT DOCUMENTS

| | | |
|---|---|---|
| JP | 2000-244285 A | 9/2000 |
| JP | 2002-043524 A | 2/2002 |
| JP | 2006-33594 A | 2/2006 |

OTHER PUBLICATIONS

International Search Report of PCT/JP2009/058647, mailing date Jun. 2, 2009.

Chinese Office Action dated Sep. 18, 2012, issued in corresponding Chinese Patent Application No. 200980115837.8, (7 pages). With English Translation.

* cited by examiner

PRIOR ART

A/D CONVERSION CIRCUIT INCLUDING A PULSE TRANSIT CIRCUIT

TECHNICAL FIELD

The present invention relates to an A/D conversion circuit that converts an analog signal into a digital signal.

Priority is claimed on Japanese Patent Application No. 2008-121208, filed May 7, 2008, the contents of which are incorporated herein by reference.

BACKGROUND ART

Conventionally, the structure shown in FIG. 19 is known as an example of an A/D (analog/digital) conversion circuit (see, for example, Non-patent document 1). FIG. 19 shows the structure of a conventionally known A/D conversion circuit.

In the example shown in FIG. 19, an A/D conversion circuit 190 includes a pulse transit circuit 191, a counter 192, an encoder 193, a first latch circuit 194, a second latch circuit 195, a third latch circuit 196, and a computing device 197. In the pulse transit circuit 191, a single NAND (Negative AND) circuit 1911, which serves as a startup inverter circuit, and a plurality of inverter (INV) circuits 1912, which serve as inverter circuits, are connected in a ring shape. The NAND circuit 1911 operates by receiving a pulse signal StartP via one input terminal. The counter 192 and the encoder 193 measure output signals from the pulse transit circuit 191. The first latch circuit 194 holds output signals from the counter 192. The second latch circuit 195 holds output signals from the encoder 193. The third latch circuit 196 adds together output signals from the first latch circuit 194 and the second latch circuit 195, and holds the result. The computing device 197 computes a difference between a previous signal and a current signal using the third latch circuit 196, and outputs the result to an external latter-stage circuit.

Moreover, in the example shown in FIG. 19, a power supply line 1913 that supplies power to the NAND circuit 1911 and the inverter circuits 1912 of the pulse transit circuit 191 is connected to an input terminal 198. An analog input signal Vin which is to be subjected to A/D conversion is input into the input terminal 198. The encoder 193 and the first and second latch circuits 194 and 195 receive the input of a clock (CLK) signal CKs.

Next, operations of the A/D conversion circuit 190 will be described. As is shown in FIG. 19, in the pulse transit circuit 191, the pulse signal StartP transits around a circuit orbit formed by the single NAND circuit 1911 and the plurality of inverter circuits 1912 which are formed in a ring shape.

The pulse signal StartP changes in accordance with the size (i.e. the voltage) of the analog input signal Vin and the period of the clock (CLK) signal CKs. The counter 192 counts the number of times the pulse signal StartP transits around the circuit orbit within the pulse transit circuit 191, and outputs the result of this count as binary digital data. The encoder 193 detects the position of the pulse signal StartP in the circuit within the pulse transit circuit 191, and outputs this result as binary digital data.

The first latch circuit 194 holds digital data output by the counter 192. The second latch circuit 195 holds digital data output by the encoder 193. The third latch circuit 196 acquires the digital data held by the first latch circuit 194 as high-order bits, and acquires the digital data latched by the second latch circuit 195 as low-order bits, and adds together these groups of digital data. By doing this, the third latch circuit 196 creates and holds binary digital data that corresponds to the size of the analog input signal Vin for each period of the clock signal CKs.

The computing device 197 computes the difference between the digital data held by the third latch circuit 196 and the previous digital data held by the latch circuit 196, and outputs the computed digital data DT to the external latter-stage circuit.

FIG. 20 is a graph showing a relationship between the size of the analog input signal Vin in the A/D conversion circuit 190, and the propagation delay time of the pulse signal StartP transiting within the circuit. In the A/D conversion circuit 190, if the size of the analog input signal Vin is small, the propagation delay time of the pulse signal StartP increases, while if the size of the analog input signal Vin is large, the propagation delay time of the pulse signal StartP decreases. Accordingly, digital data that corresponds to the propagation delay time of this pulse signal StartP is output from the A/D conversion circuit 190.

FIG. 21 is a drawing showing a relationship between the sampling period in the A/D conversion circuit 190 and the timings at which digital data is output. The A/D conversion circuit 190 periodically outputs the digital data DT for each period of the clock signal CKs which is a sampling period. In the example shown in the drawing, digital data 2121 is output in the sampling period 2111, digital data 2122 is output in the sampling period 2112, and digital data 2123 is output in the sampling period 2113.

As is described above, the A/D conversion circuit 190 periodically outputs digital data DT that corresponds to the size of the analog input signal Vin for each period of the clock signal CKs.

[Non-patent document 1] "An All-Digital Analog-to-Digital Converter With 12-µ V/LSB Using Moving-Average Filtering", IEEE JOURNAL OF SOLID-STATE CIRCUITS, VOL. 38, NO. 1, JANUARY 2002

DISCLOSURE OF THE INVENTION

Problems to be Solved by the Invention

However, in the above-described A/D conversion circuit 190, the NAND circuit 1911 and the inverter circuits 1912 are used in combination as the inverter circuits making up the pulse transit circuit 191. The NAND circuit 1911 and the inverter circuits 1912 have their own respective propagation delay times which are unique to their circuits, and, generally, their respective propagation delay times are mutually different. Accordingly, there is a possibility that the accuracy of the low-order bits output by the encoder 193 will be deteriorated due to these differences in the propagation delay times.

The present invention was conceived in view of the above described circumstances, and it is an object thereof to provide an A/D conversion circuit having a simple circuit structure that is able to suppress any deterioration in the accuracy of an A/D conversion.

Means for Solving the Problems

The A/D conversion circuit of one aspect of the present invention is provided with: a pulse transit circuit into which either a power supply or current source is input and a pulse signal is also input, and through which the pulse signal transits; a transit position detection section that detects a transit position of the pulse signal within the pulse transit circuit, and outputs data in accordance with the transit position; and a digital data creation section that, based on the data output by the transit position detection section, creates digital data that corresponds to the size of the power supply or current source, in which: the pulse transit circuit is formed by a plurality of inverter circuits that are joined together in series; the plurality of inverter circuits are formed by identical logical elements in which delay times between input signals and output signals change in accordance with the size of the power supply or current source; in the pulse transit circuit, a start-up signal that causes the transiting of the pulse signal to commence is input into one of the plurality of inverter circuits; and the transit position detection section detects the transit position of the pulse signal within the pulse transit circuit based on the output signals from each one of the plurality of inverter circuits.

According to the A/D conversion circuit of the present invention, because the pulse transit circuit is formed by identical logical elements, there is no occurrence of deterioration in the A/D conversion accuracy that is due to different logical elements being provided in the pulse transit circuit. Accordingly, it becomes possible to achieve a highly accurate A/D conversion circuit.

Moreover, in the A/D circuit of the present invention, the logical elements may be NAND circuits.

By employing this type of structure, even if the inverter circuits that make up the pulse transit circuit are formed by identical logical elements, it is possible to limit the increase in the number of transistors used in the logical circuits to an absolute minimum. Accordingly, it is possible to limit the increase in the surface area and the like of the chips which are provided in the A/D conversion circuit.

Moreover, in the A/D circuit of the present invention, the logical elements may be NOR circuits.

Moreover, in the A/D circuit of the present invention, the logical elements may be fully differential delay circuits.

Advantageous Effects of the Invention

According to the A/D conversion circuit of the present invention, it is possible to suppress any deterioration in the accuracy of an A/D conversion using a simple circuit structure.

BEST MODE FOR CARRYING OUT THE INVENTION

First Embodiment

A first embodiment of the present invention will now be described with reference made to the drawings. An A/D (analog/digital) conversion circuit of the present embodiment includes a pulse transit circuit, a counter and an encoder (i.e., a transit position detection section) that measure output signals from the pulse transit circuit, a first latch circuit that holds output signals from the counter, a second latch circuit that holds output signals from the encoder, a third latch circuit that adds together the output signals from the first latch circuit and the second latch circuit and holds the result, and a computing device (i.e., a digital data creation section) that computes the difference between the previous signal and the current signal using the third latch circuit, and outputs the result to an external latter-stage circuit.

Figure 19:
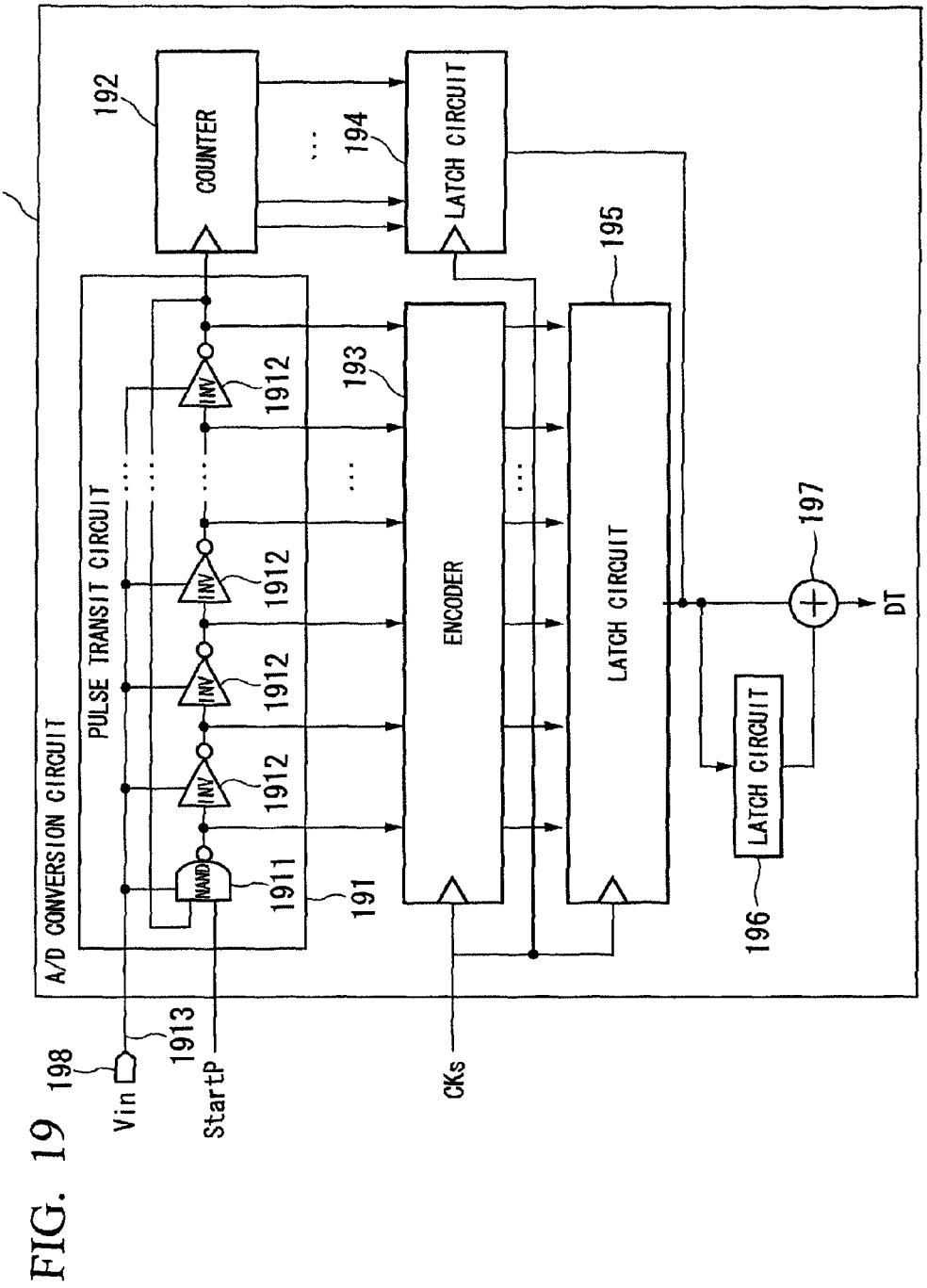
FIG. 19 is a structural diagram showing the structure of a conventionally known A/D conversion circuit.
Figure 20:
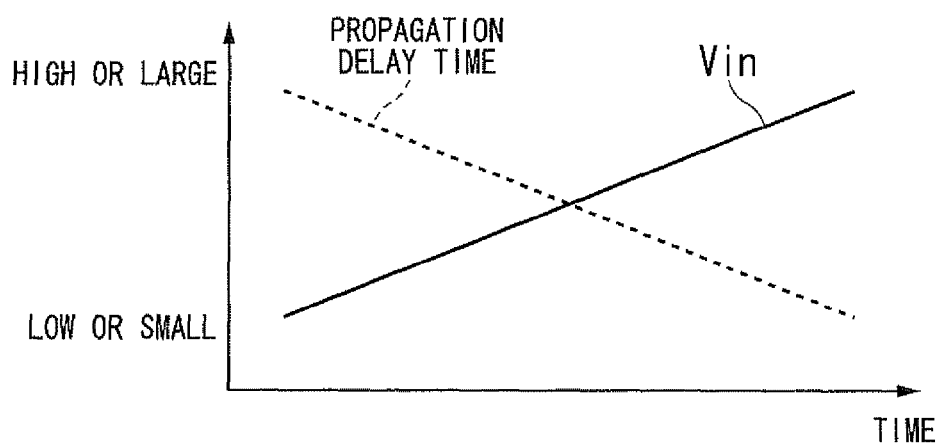
FIG. 20 is a graph showing a relationship between the size of an analog input signal in an A/D conversion circuit, and the propagation delay time of a pulse signal transiting around the circuit.
Figure 21:
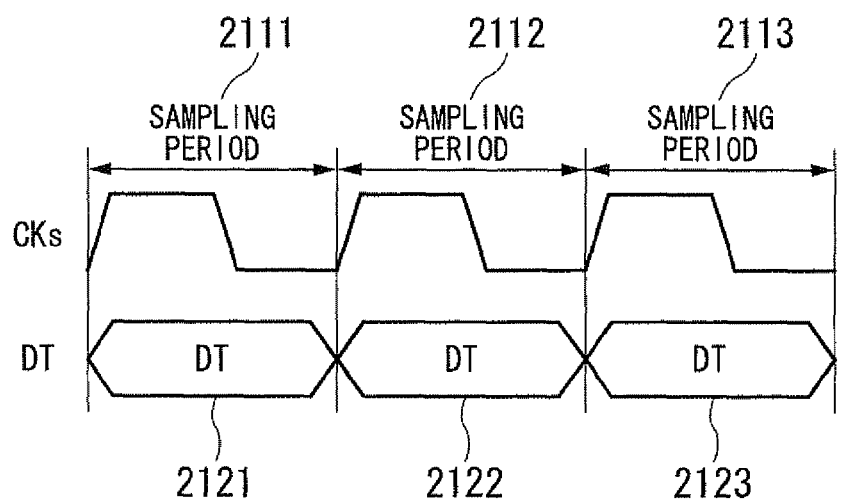
FIG. 21 is a drawing showing a relationship between a sampling period in an A/D conversion circuit and timings at which digital data is output.

Moreover, the A/D conversion circuit of the present embodiment differs from the A/D conversion circuit shown in FIG. 19 only in the structure of a pulse transit circuit, and the respective portions other than the pulse transit circuit have the same structures as the respective portions shown in FIG. 19.

Figure 1:
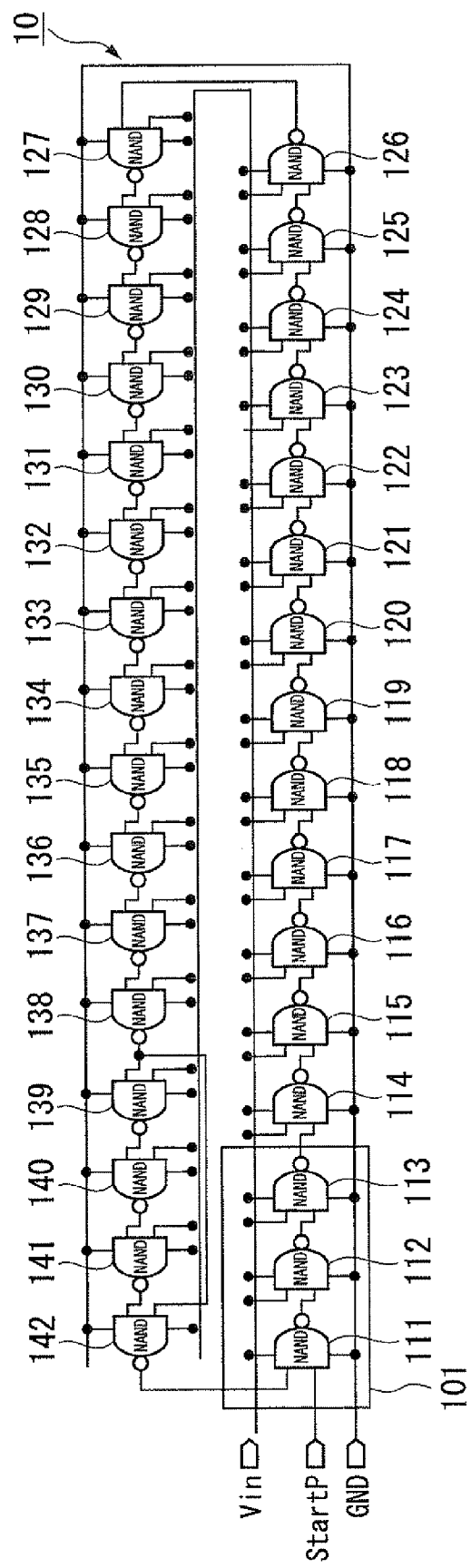
FIG. 1 is a circuit diagram showing a pulse transit circuit of a first embodiment of the present invention.
Figure 2:
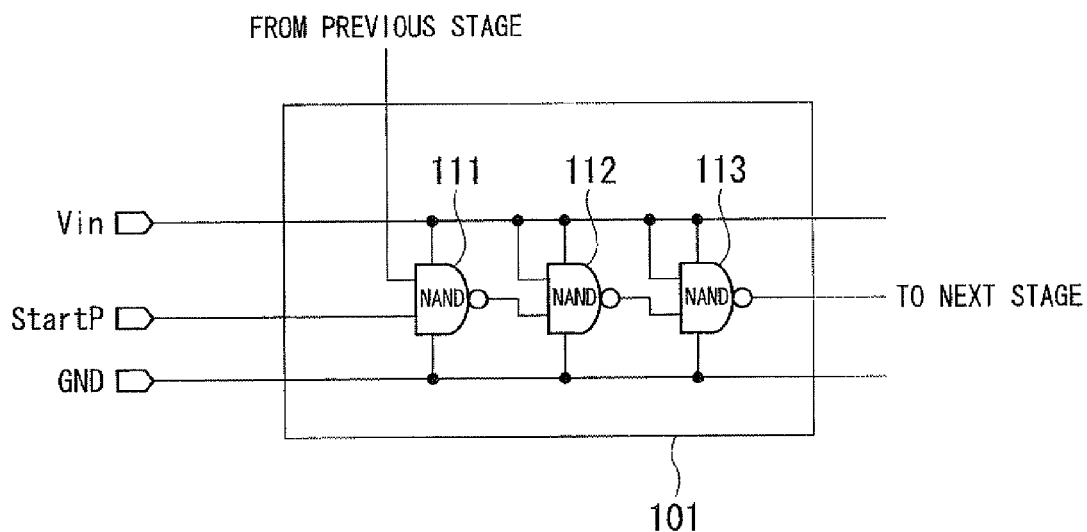
FIG. 2 is a partial expanded view showing a portion of the pulse transit circuit of the first embodiment of the present invention.

FIG. 1 is a circuit diagram showing a pulse transit circuit 10 of the present embodiment. In the example shown in this drawing, the pulse transit circuit 10 is a circuit in which 32 NAND circuits 111 through 142 are connected together in series.

In the pulse transit circuit 10 of the present embodiment, a single NAND circuit (i.e., the NAND circuit 111) which is a startup inverter circuit, and a number of NAND circuits (i.e., the NAND circuits 112 to 142) that operate as inverter circuits are joined together in a ring shape. The NAND circuit 111 operates by receiving a pulse signal StartP via one input terminal thereof, and by receiving outputs from the NAND circuit 142 located at the previous stage thereto via the other input terminal thereof. The respective NAND circuits 112 through 141 operate by receiving outputs from the NAND circuit located at the previous stage thereto (for example, from the NAND circuit 111 in the case of the NAND circuit 112) via one input terminal thereof, and by receiving a High level (i.e., the analog input signal Vin or a power supply VDD of the A/D conversion circuit) via the other input terminal thereof. The NAND circuit 142 receives the output from the NAND circuit 141 located at the previous stage thereto via one input terminal and, instead of receiving a High level, receives the output from the NAND circuit 138 as a feed-forward loop via the other input terminal. As a result of this, while the pulse signal StartP is being input, the outputs from each NAND circuit are oscillated at periods that correspond to the delay times of the NAND circuits 111 to 142.

Note that the structure of the feed-forward loop is not limited to the structure described above. For example, only one input terminal of the NAND circuit 140 may receive the output from the NAND circuit 136 as a feed-forward loop instead of receiving a High level. Moreover, the total number of NAND circuits forming the pulse transit circuit 10 is not limited to 32, and there are no particular restrictions provided that this number is an even number of four or more.

Figure 3:
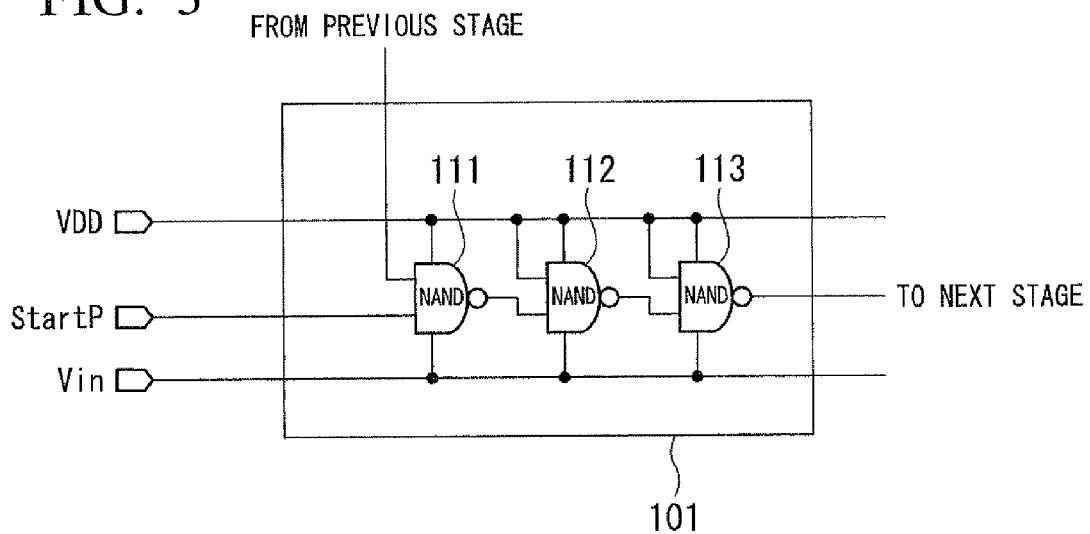
FIG. 3 is a partial expanded view showing a portion of the pulse transit circuit of the first embodiment of the present invention.
Figure 4:
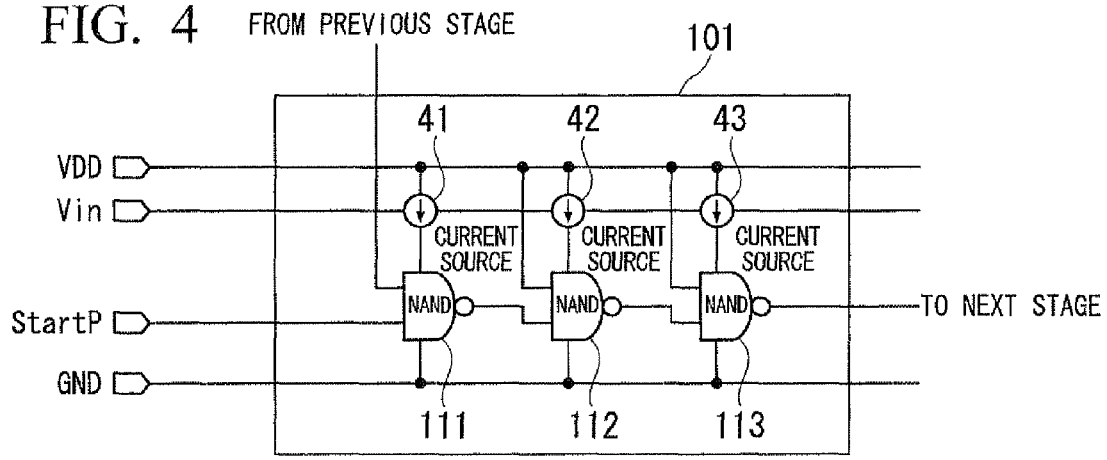
FIG. 4 is a partial expanded view showing a portion of the pulse transit circuit of the first embodiment of the present invention.
Figure 5:
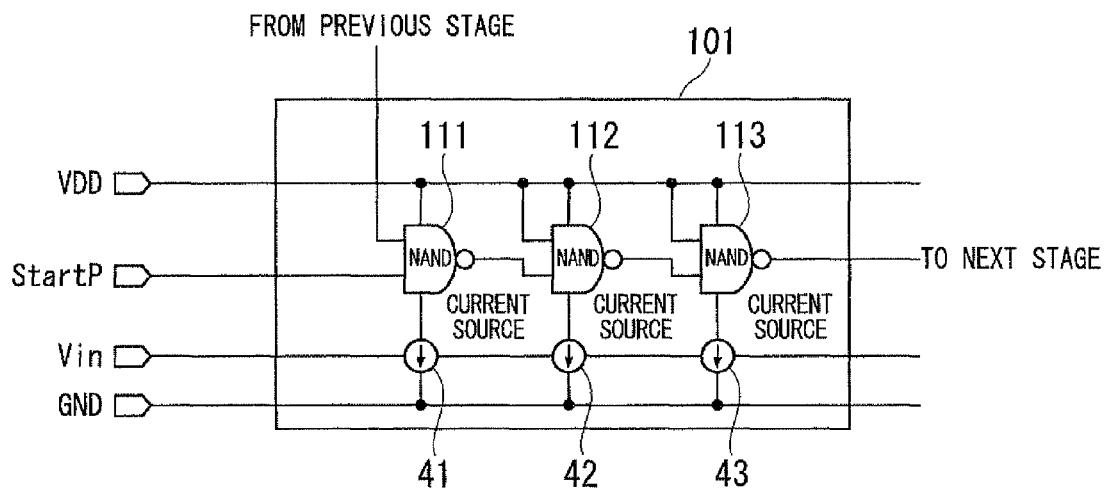
FIG. 5 is a partial expanded view showing a portion of the pulse transit circuit of the first embodiment of the present invention.

FIG. 2 through FIG. 5 are partial expanded views showing a portion (i.e., a portion indicated by the symbol 101 in FIG. 1) of the pulse transit circuit 10 of the present embodiment. The entire structure of the pulse transit circuit 10 of the present embodiment may be the structure shown in FIG. 2 through FIG. 5. In the example shown in FIG. 2, the propagation delay times of the inverter circuits are controlled by using the level (i.e., size) of the analog input signal Vin as the power supply for the inverter circuits. Moreover, as is shown in FIG. 3, the level of the analog input signal Vin which is input into the pulse transit circuit 10 may be connected to the GND side of the inverter circuits. As is shown in FIG. 4, the propagation delay times of the inverter circuits may be controlled by using current sources 41 to 43 which have current values that correspond to the level of the analog input signal Vin. Moreover, as is shown in FIG. 5, the current sources 41 to 43 may be connected to the GND side of the inverter circuits. Furthermore, although not shown, the current sources may be connected to both the power supply VDD side and the GND side of the inverter circuits.

Note that an example has been described in which the pulse transit circuit 10 is formed by an even number of four or more NAND circuits, however, the pulse transit circuit of the present embodiment may also be formed as a pulse transit circuit 20 which is formed by an odd number of three or more NAND circuits.

Figure 6:
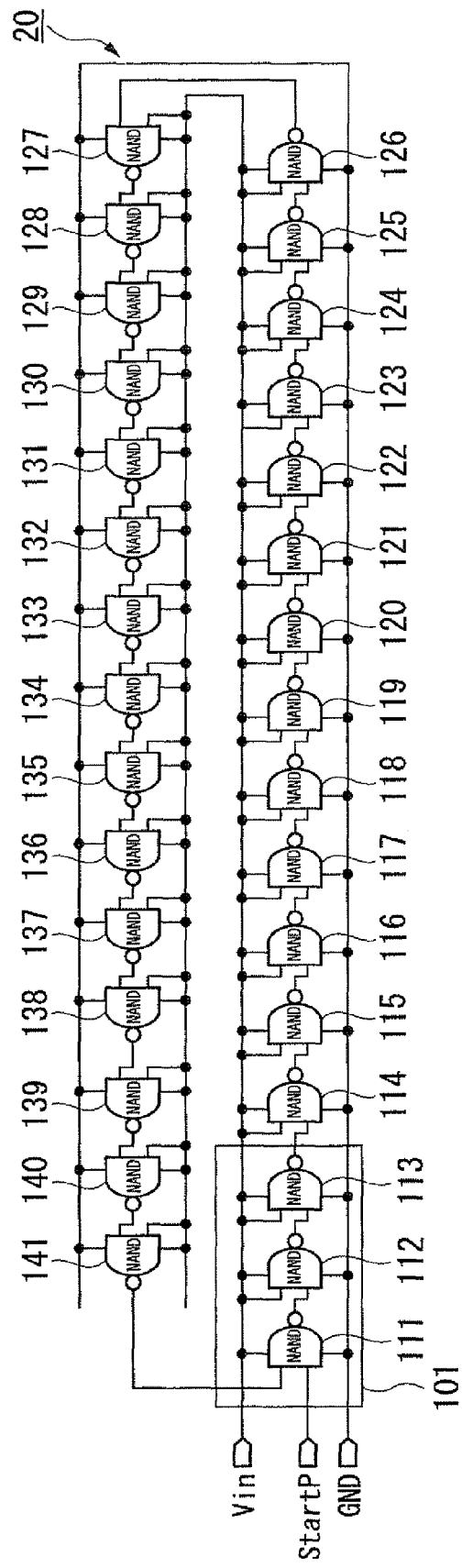
FIG. 6 is a circuit diagram showing a pulse transit circuit of a variant example of the first embodiment of the present invention.

FIG. 6 is a circuit diagram showing the pulse transit circuit 20 of a variant example of the present embodiment. In the example shown in FIG. 6, the pulse transit circuit 20 is a circuit in which 31 NAND circuits 111 through 141 are connected together in series.

In the pulse transit circuit 20 of the present embodiment, a single NAND circuit (i.e., the NAND circuit 111) which is a startup inverter circuit, and a number of NAND circuits (i.e., the NAND circuits 112 to 141) that operate as inverter circuits are joined together in a ring shape. The NAND circuit 111 operates by receiving a pulse signal StartP via one input terminal thereof, and by receiving outputs from the NAND circuit 141 located at the previous stage thereto via the other input terminal thereof. The respective NAND circuits 112 through 141 operate by receiving outputs from the NAND circuit located at the previous stage thereto via one input terminal thereof, and by receiving a High level (i.e., the analog input signal Vin or a power supply VDD of the A/D conversion circuit) via the other input terminal thereof.

Note that the total number of NAND circuits forming the pulse transit circuit 20 is not limited to 31, and there are no particular restrictions provided that this number is an odd number of three or more. Moreover, in the same way as the pulse transit circuit 10, the structure of the pulse transit circuit 20 may be the structure shown in FIG. 2 through FIG. 5. Furthermore, although not shown, the structure of the pulse transit circuit 20 may be a structure in which the current sources are connected to both the power supply VDD side and the GND side of the inverter circuits.

As has been described above, in the present embodiment, it is possible to construct the inverter circuits that make up a pulse transit circuit using only identical logical elements (i.e., NAND circuits), and it is possible to achieve a pulse transit circuit in which there are no propagation delay time differences between the respective inverter circuits. Accordingly, according to the present embodiment, it is possible to suppress any deterioration in the accuracy of an A/D conversion using a simple circuit structure.

Second Embodiment

A description will now be given of a second embodiment of the present invention with reference made to the drawings. The A/D circuit structure of the present embodiment differs from the A/D conversion circuit shown in FIG. 19 only in the structure of a pulse transit circuit, and the respective portions other than the pulse transit circuit have the same structures as the respective portions shown in FIG. 19.

Moreover, a difference between the present embodiment and the first embodiment is the fact that a NOR (non-logical sum) circuit is used for the inverter elements making up the pulse transit circuit.

Figure 7:
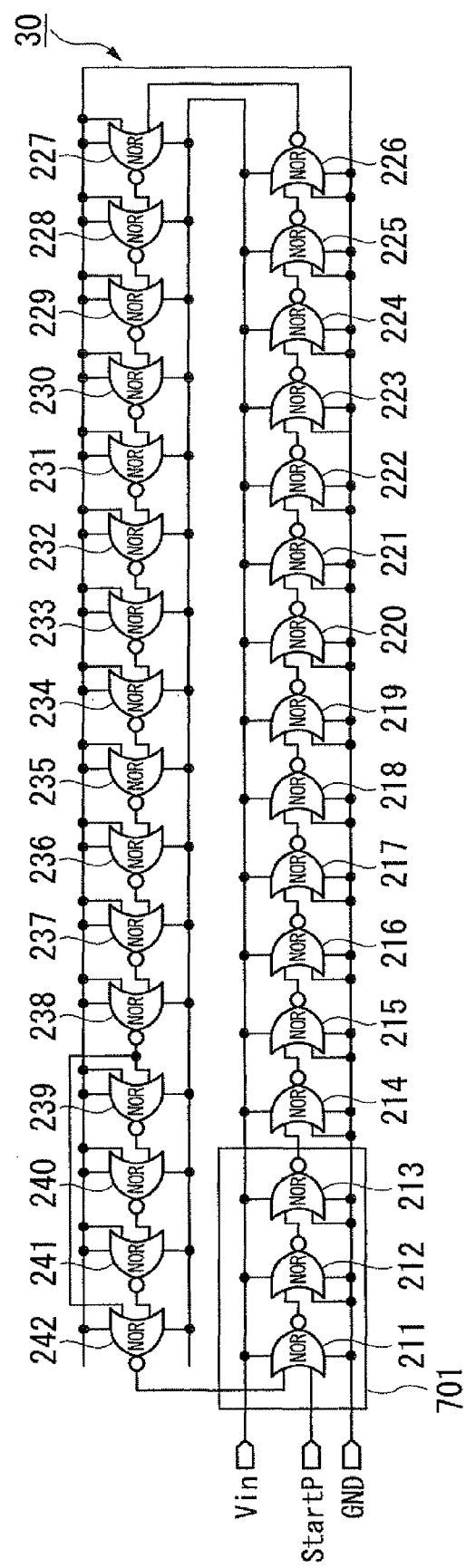
FIG. 7 is a circuit diagram showing a pulse transit circuit of a second embodiment of the present invention.
Figure 8:
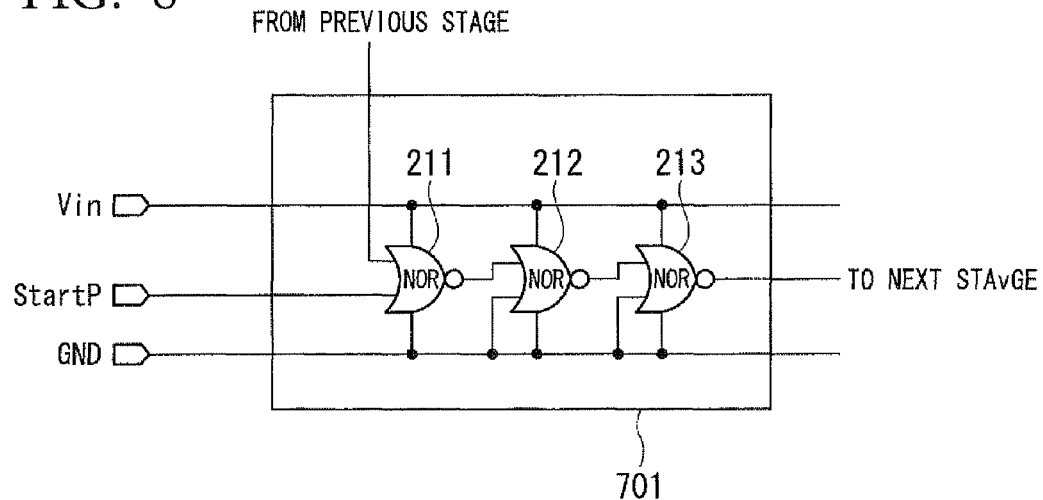
FIG. 8 is a partial expanded view showing a portion of the pulse transit circuit of the second embodiment of the present invention.

FIG. 7 is a circuit diagram showing a pulse transit circuit 30 of the present embodiment. In the example shown in this drawing, the pulse transit circuit 30 is a circuit in which 32 NOR circuits 211 through 242 are connected together in series.

In the pulse transit circuit 30 of the present embodiment, a single NOR circuit (i.e., the NOR circuit 211) which is a startup inverter circuit, and a number of NOR circuits (i.e., the NOR circuits 212 to 242) that operate as inverter circuits are joined together in a ring shape. The NOR circuit 211 operates by receiving a pulse signal StartP via one input terminal thereof, and by receiving outputs from the NOR circuit 242 located at the previous stage thereto via the other input terminal thereof. The respective NOR circuits 212 through 241 operate by receiving outputs from the NOR circuit located at the previous stage thereto (for example, from the NOR circuit 211 in the case of the NOR circuit 212) via one input terminal thereof, and by receiving a Low level (i.e., GND) via the other input terminal thereof. The NOR circuit 242 receives the output from the NOR circuit 241 located at the previous stage thereto via one input terminal and, instead of receiving a Low level, receives the output from the NOR circuit 238 as a feed-forward loop via the other input terminal. The reason for this is that, because the pulse transit circuit 30 is formed by an even number of NOR circuits in the present embodiment, the output from the NOR circuit 242 is inverted in order for the NOR circuits 211 to 242 to output a different value each time the pulse signal StartP passes through. Moreover, because the pulse transit circuit 30 uses NOR circuits for the inverter circuits, it is started by the pulse signal StartP changing from a High level to a Low level.

Note that the structure of the feed-forward loop is not limited to the structure described above. For example, only one input terminal of the NOR circuit 240 may receive the output from the NOR circuit 236 as a feed-forward loop instead of receiving a Low level. Moreover, the total number of NOR circuits forming the pulse transit circuit 30 is not limited to 32, and there are no particular restrictions provided that this number is an even number of four or more.

Figure 9:
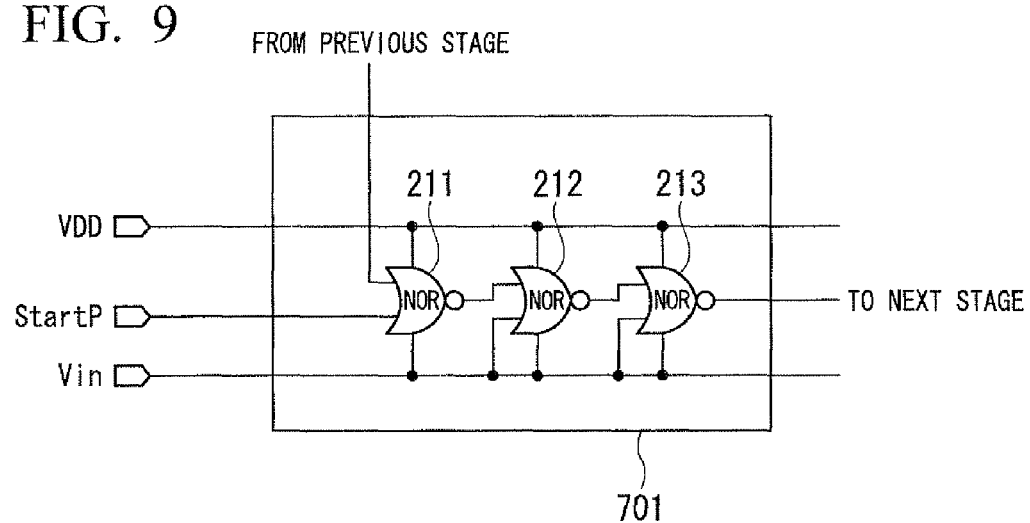
FIG. 9 is a partial expanded view showing a portion of the pulse transit circuit of the second embodiment of the present invention.
Figure 10:
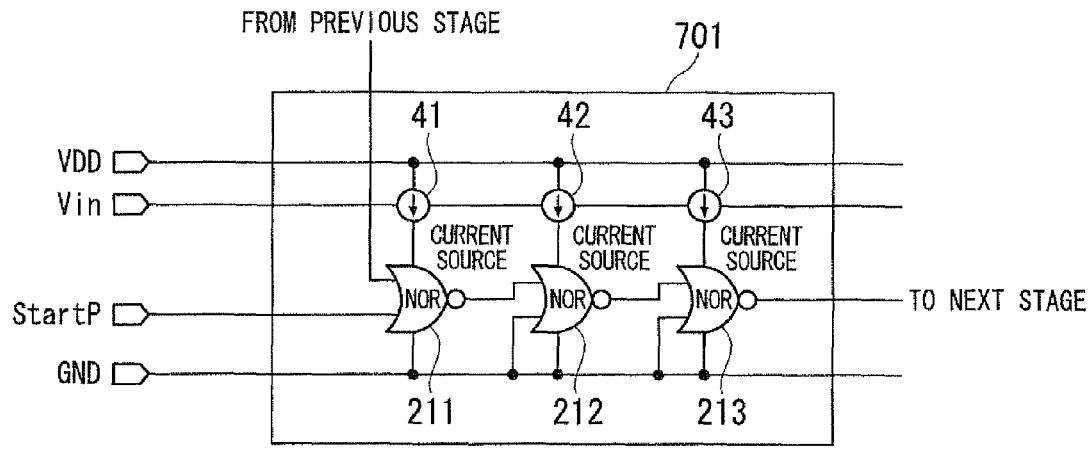
FIG. 10 is a partial expanded view showing a portion of the pulse transit circuit of the second embodiment of the present invention.
Figure 11:
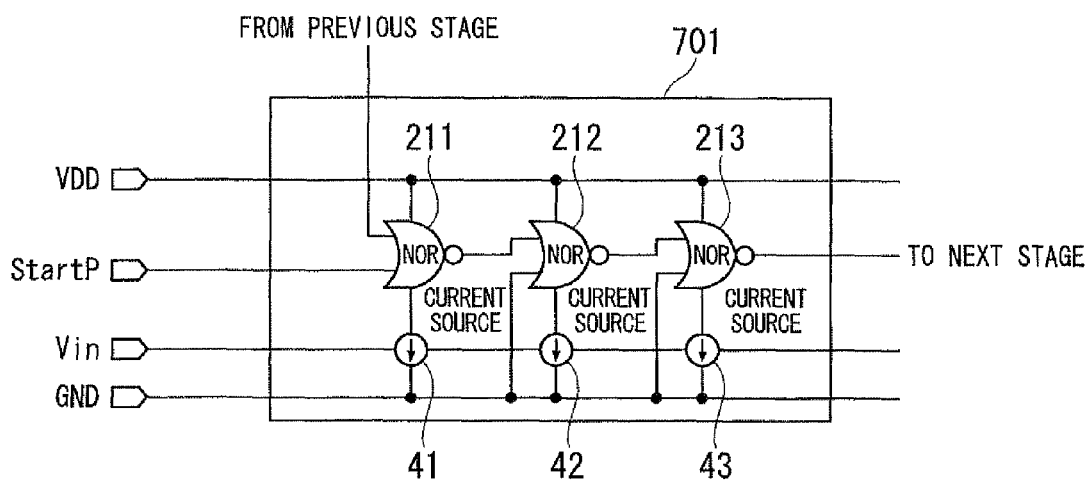
FIG. 11 is a partial expanded view showing a portion of the pulse transit circuit of the second embodiment of the present invention.

FIG. 8 through FIG. 11 are partial expanded views showing a portion (i.e., a portion indicated by the symbol 701 in FIG. 7) of the pulse transit circuit 30 of the present embodiment. The entire structure of the pulse transit circuit 30 of the present embodiment may be the structure shown in FIG. 8 through FIG. 11. In the example shown in FIG. 8, the propagation delay times of the inverter circuits are controlled by using the level of the analog input signal Vin as the power supply for the inverter circuits. Moreover, as is shown in FIG. 9, the level of the analog input signal Vin which is input into the pulse transit circuit 30 may be connected to the GND side of the inverter circuits. Moreover, as is shown in FIG. 10, the propagation delay times of the inverter circuits may be controlled by using current sources 41 to 43 which have current values that correspond to the level of the analog input signal Vin. Moreover, as is shown in FIG. 11, the current sources 41 to 43 may be connected to the GND side of the inverter circuits. Furthermore, although not shown, the current sources may be connected to both the power supply VDD side and the GND side of the inverter circuits.

Note that an example has been described in which the pulse transit circuit 30 is formed by an even number of four or more NOR circuits, however, the pulse transit circuit of the present embodiment may be formed as a pulse transit circuit 40 which is formed by an odd number of three or more NOR circuits.

Figure 12:
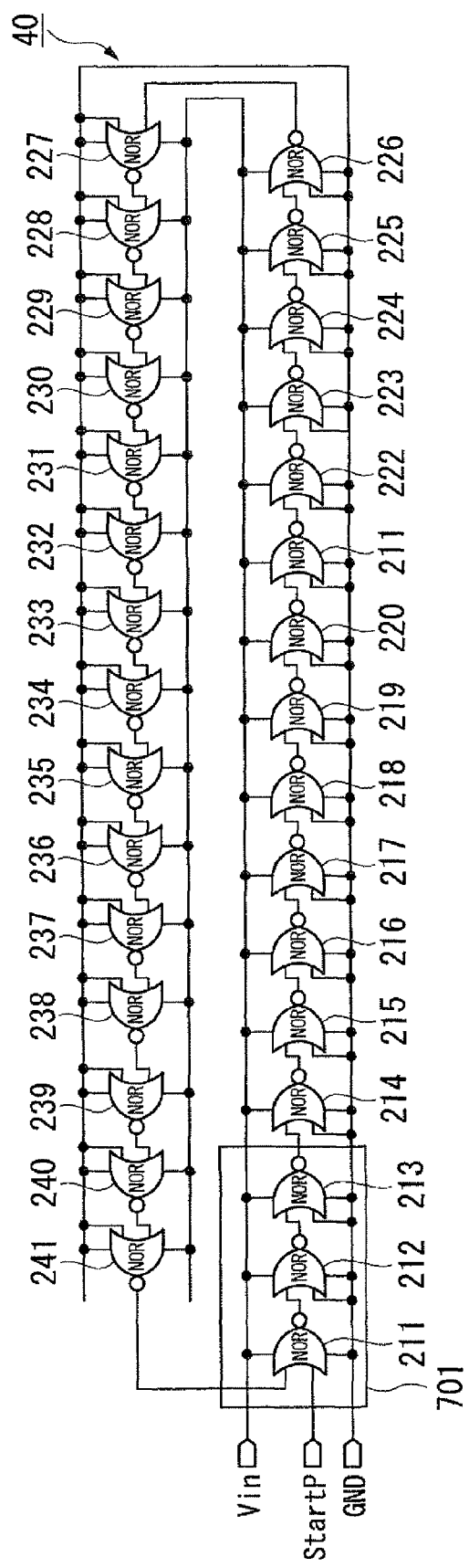
FIG. 12 is a circuit diagram showing a pulse transit circuit of a variant example of the second embodiment of the present invention.

FIG. 12 is a circuit diagram showing the pulse transit circuit 40 of a variant example of the present embodiment. In the example shown in FIG. 12, the pulse transit circuit 40 is a circuit in which 31 NOR circuits 211 through 241 are connected together in series.

In the pulse transit circuit 40 of the present variant example, a single NOR circuit (i.e., the NOR circuit 211) which is a startup inverter circuit, and a number of NOR circuits (i.e., the NOR circuits 212 through 241) that operate as inverter circuits are joined together in a ring shape. The NOR circuit 211 operates by receiving a pulse signal StartP via one input terminal thereof, and by receiving outputs from the NOR circuit 241 located at the previous stage thereto via the other input terminal thereof. The respective NOR circuits 212 through 241 operate by receiving outputs from the NOR circuit located at the previous stage thereto via one input terminal thereof, and by receiving a Low level (i.e., GND) via the other input terminal thereof.

Note that the total number of NOR circuits forming the pulse transit circuit 40 is not limited to 31, and there are no particular restrictions provided that this number is an odd number of three or more. Moreover, in the same way as the pulse transit circuit 30, the structure of the pulse transit circuit 40 may be the structure shown in FIG. 8 through FIG. 11. Furthermore, although not shown, the structure of the pulse transit circuit 40 may be a structure in which the current sources are connected to both the power supply VDD side and the GND side of the inverter circuits.

As has been described above, in the present embodiment, it is possible to construct the inverter circuits that make up a pulse transit circuit using only identical logical elements (i.e., NOR circuits), and it is possible to achieve a pulse transit circuit in which there are no propagation delay time differences between the respective inverter circuits. Accordingly, according to the present embodiment, it is possible to suppress any deterioration in the accuracy of an A/D conversion using a simple circuit structure.

Third Embodiment

A description will now be given of a third embodiment of the present invention with reference made to the drawings. The A/D circuit structure of the present embodiment differs from the A/D conversion circuit shown in FIG. 19 only in the structure of the pulse transit circuit, and the respective portions other than the pulse transit circuit have the same structures as the respective portions shown in FIG. 19.

Moreover, a difference between the present embodiment and the first embodiment and second embodiment is the fact that a fully differential delay circuit (DE) is used for the inverter elements making up the pulse transit circuit.

Figure 13:
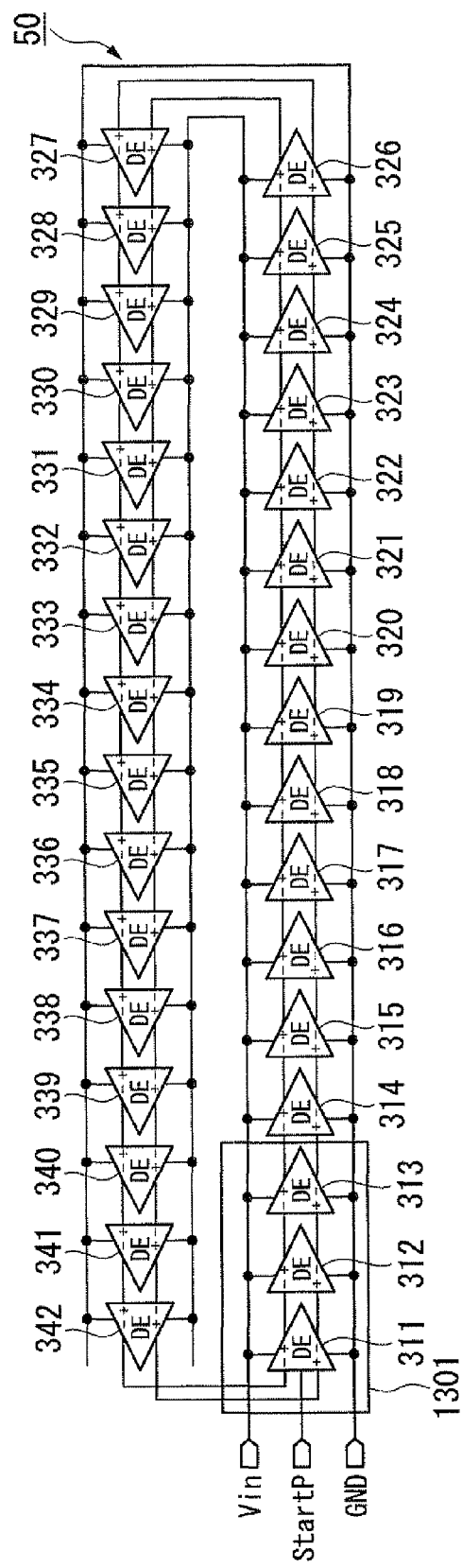
FIG. 13 is a circuit diagram showing a pulse transit circuit of a third embodiment of the present invention.
Figure 14:
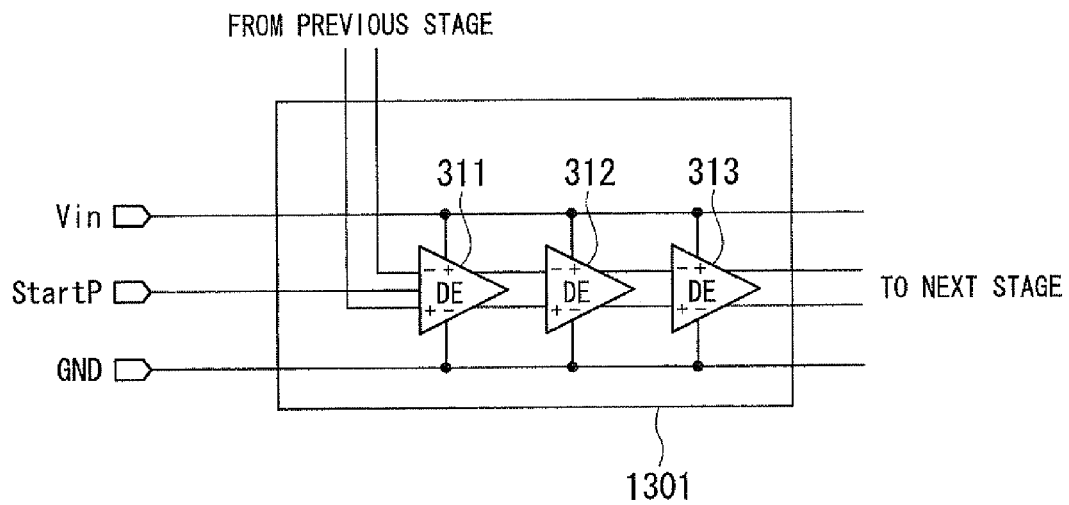
FIG. 14 is a partial expanded view showing a portion of the pulse transit circuit of the third embodiment of the present invention.

FIG. 13 is a circuit diagram showing a pulse transit circuit 50 of the present embodiment. In the example shown in this drawing, the pulse transit circuit 50 is a circuit in which 32 DEs 311 through 342 are connected together in series.

In the pulse transit circuit 50 of the present embodiment, a single fully differential delay circuit (i.e., the DE 311) which is a startup inverter circuit, and a number of fully differential delay circuits (i.e., the DEs 312 through 342) are joined together in a ring shape. The DE 311 operates by receiving the pulse start signal StartP via a trigger terminal thereof, by receiving positive outputs from the fully differential delay circuit DE 342 located at the previous stage thereto via a positive input terminal thereof, and by receiving negative outputs from the fully differential delay circuit DE 342 located at the previous stage thereto via a negative input terminal thereof. The respective DEs 312 through 342 operate by receiving negative outputs from the fully differential delay circuit located at the previous stage thereto (i.e., from the DE 311 in the case of the DE 312) via the positive input terminal thereof, and by receiving positive outputs from the fully differential delay circuit located at the previous stage thereto via the negative input terminal thereof.

Note that in the pulse transit circuit 50 of the present embodiment, when Low is input into the trigger terminal of the DE 311, the voltages of the input and output terminals of the DEs 311 through 342 are fixed, while when High is input into the trigger terminal of the DE 311, operations are started without the voltages of the input and output terminals of the DE 311 through 342 being fixed. Moreover, the total number of DEs forming the pulse transit circuit 50 is not limited to 32, and there are no particular restrictions provided that this number is an even number of four or more.

Figure 15:
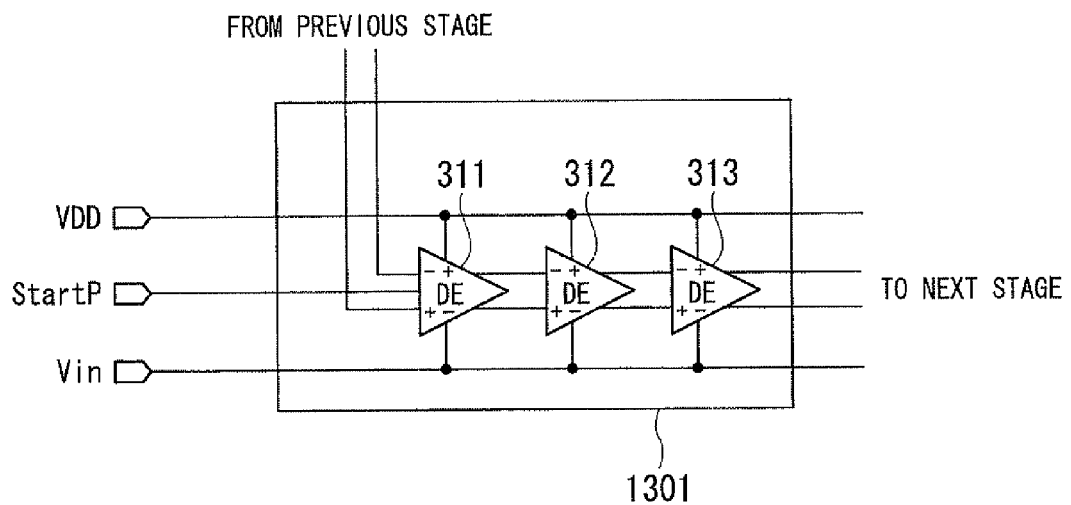
FIG. 15 is a partial expanded view showing a portion of the pulse transit circuit of the third embodiment of the present invention.
Figure 16:
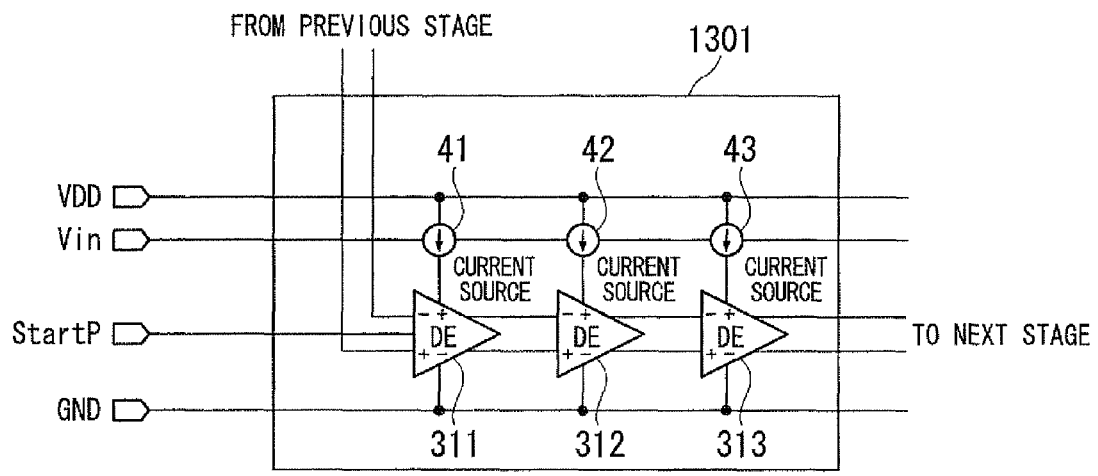
FIG. 16 is a partial expanded view showing a portion of the pulse transit circuit of the third embodiment of the present invention.
Figure 17:
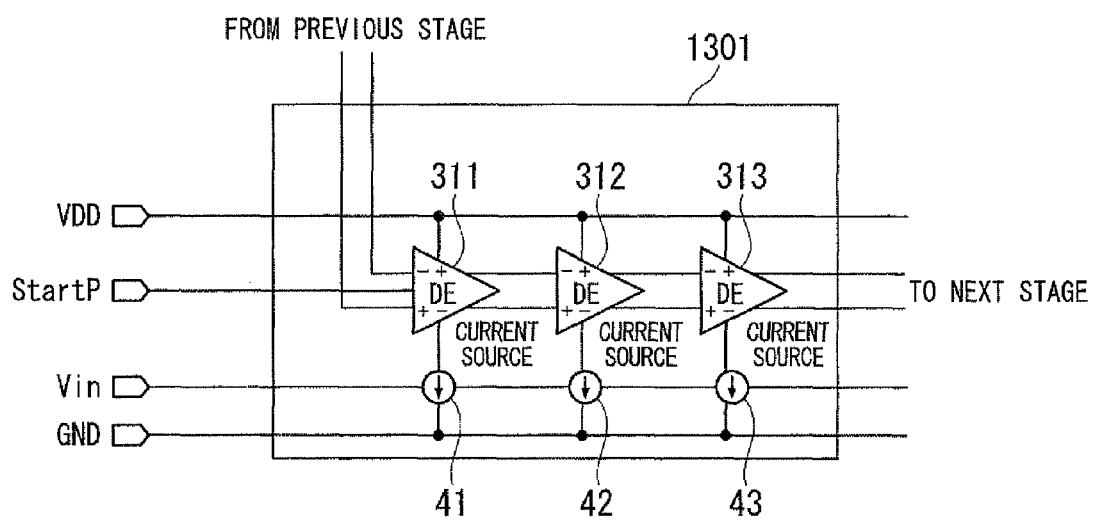
FIG. 17 is a partial expanded view showing a portion of the pulse transit circuit of the third embodiment of the present invention.

FIG. 14 through FIG. 17 are partial expanded views showing a portion (i.e., a portion indicated by the symbol 1301 in FIG. 13) of the pulse transit circuit 50 of the present embodiment. The entire structure of the pulse transit circuit 50 of the present embodiment may be the structure shown in FIG. 14 through FIG. 17. In the example shown in FIG. 14, the propagation delay times of the inverter circuits are controlled by using the level of the analog input signal Vin as the power supply for the inverter circuits. Moreover, as is shown in FIG. 15, the level of the analog input signal Vin which is input into the pulse transit circuit 50 may be connected to the GND side of the inverter circuits. Moreover, as is shown in FIG. 16, the propagation delay times of the inverter circuits may be controlled by using current sources 41 through 43 which have current values that correspond to the level of the analog input signal Vin. Moreover, as is shown in FIG. 17, the current sources 41 to 43 may also be connected to the GND side of the inverter circuits. Furthermore, although not shown, the current sources may also be connected to both the power supply VDD side and the GND side of the inverter circuits.

Note that an example has been described in which the pulse transit circuit 50 is formed by an even number of four or more fully differential delay circuits, however, the pulse transit circuit of the present embodiment may also be formed as a pulse transit circuit 60 which is formed by an odd number of three or more fully differential delay circuits.

Figure 18:
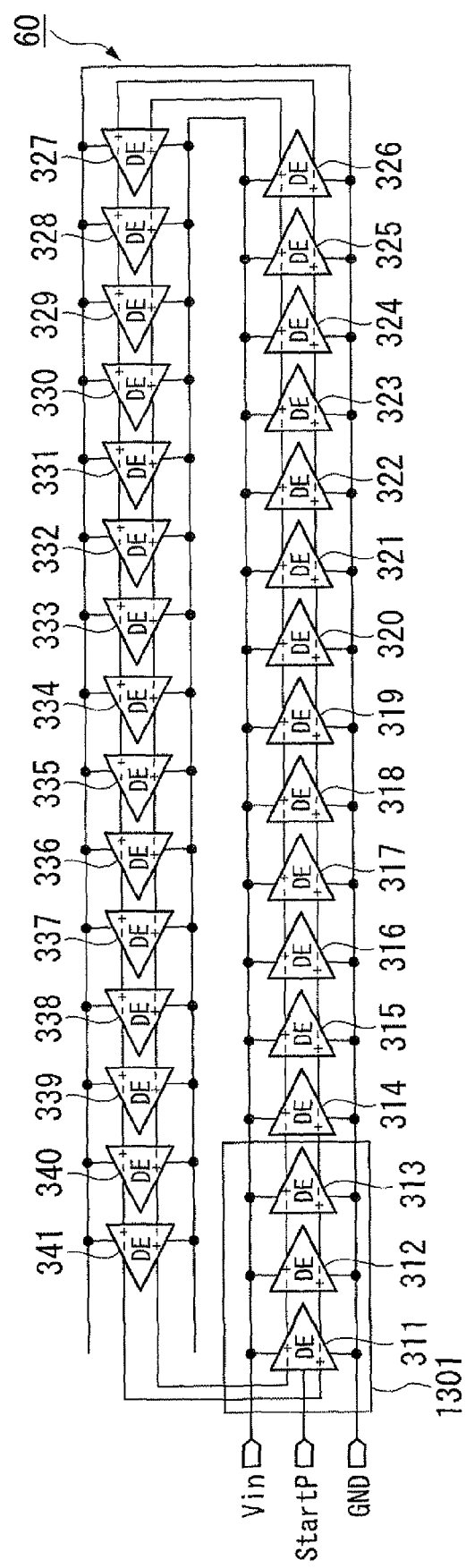
FIG. 18 is a circuit diagram showing a pulse transit circuit of a variant example of the third embodiment of the present invention.

FIG. 18 is a circuit diagram showing the pulse transit circuit 60 of a variant example of the present embodiment. In the example shown in FIG. 18, the pulse transit circuit 60 is a circuit in which 31 DEs 311 through 341 are connected together in series.

In the pulse transit circuit 60 of the present variant example, a single fully differential delay circuit (i.e., the DE 311) which is a startup inverter circuit, and a number of fully differential delay circuits (i.e., the DEs 312 through 341) are joined together in a ring shape. The DE 311 operates by receiving the pulse start signal StartP via a trigger terminal thereof, by receiving negative outputs from the fully differential delay circuit DE 341 located at the previous stage thereto via a positive input terminal thereof, and by receiving positive outputs from the fully differential delay circuit DE 341 located at the previous stage thereto via a negative input terminal thereof. The respective DEs 312 through 341 operate by receiving negative outputs from the fully differential delay circuit located at the previous stage thereto via the positive input terminal thereof, and by receiving positive outputs from the fully differential delay circuit located at the previous stage thereto via the negative input terminal thereof.

Note that in the pulse transit circuit of the present variant example, when Low is input into the trigger terminal of the DE 311, the voltages of the input and output terminals of the DEs 311 through 341 are fixed, while when High is input into the trigger terminal of the DE 1, operations are started without the voltages of the input and output terminals of the DEs 311 through 341 being fixed.

Note that the total number of DEs forming the pulse transit circuit 60 is not limited to 31, and there are no particular restrictions provided that this number is an odd number of three or more. Moreover, in the same way as the pulse transit circuit 50, the structure of the pulse transit circuit 60 may be the structure shown in FIG. 14 through FIG. 17. Furthermore, although not shown, the structure of the pulse transit circuit 60 may be a structure in which the current sources are connected to both the power supply VDD side and the GND side of the inverter circuits.

As has been described above, in the present embodiment, it is possible to construct the inverter circuits that make up a pulse transit circuit using only identical logical elements (i.e., DE), and it is possible to achieve a pulse transit circuit in which there are no propagation delay time differences between the respective inverter circuits. Accordingly, according to the present embodiment, it is possible to suppress any deterioration in the accuracy of an A/D conversion using a simple circuit structure.

Embodiments of this invention have been described above in detail with reference made to the drawings, however, the specific structure thereof is not limited to these embodiments and various modification may be made thereto insofar as they do not depart from the spirit or scope of the present invention.

INDUSTRIAL APPLICABILITY

According to the A/D conversion circuit of the present invention, it is possible to suppress any deterioration in the accuracy of an A/D conversion using a simple circuit structure.

DESCRIPTION OF THE REFERENCE SYMBOLS

10, 20, 30, 40, 50, 60, 191 PULSE TRANSIT CIRCUIT
41~43 CURRENT SOURCE
111~142, 1911 NAND CIRCUIT
190 A/D CONVERSION CIRCUIT
192 COUNTER
193 ENCODER
194 FIRST LATCH CIRCUIT
195 SECOND LATCH CIRCUIT
196 THIRD LATCH CIRCUIT
197 COMPUTING DEVICE
211~242 NOR CIRCUIT
311~342 FULLY DIFFERENTIAL DELAY CIRCUIT (DE)
1912 INVERTER CIRCUIT

The invention claimed is:

1. An A/D conversion circuit comprising:
   a pulse transit circuit into which either a power supply or current source is input and a pulse signal is also input, and through which the pulse signal transits;
   a transit position detection section that detects a transit position of the pulse signal within the pulse transit circuit, and outputs data in accordance with the transit position; and
   a digital data creation section that, based on the data output by the transit position detection section, creates digital data that corresponds to the size of the power supply or current source,
   wherein:
   the pulse transit circuit is formed by a plurality of inverter circuits that are joined together in series in a ring shape;
   the plurality of inverter circuits are formed by identical logical elements in which delay times between input signals and output signals change in accordance with the size of the power supply or current source;
   in the pulse transit circuit, a start-up signal that causes the transiting of the pulse signal to commence is input into one of the plurality of inverter circuits;
   the transit position detection section detects the transit position of the pulse signal within the pulse transit circuit based on the output signals from each one of the plurality of inverter circuits;
   each of the logical elements have a first input terminal that is input the input signals, a second input terminal, an output terminal that output the output signals, and a power supply terminal that is input the power supply or current source;
   the second input terminal of one of the logical elements is input the start-up signal; and
   the second input terminal of the other of the logical elements is input the power supply or a constant power source.

2. The A/D conversion circuit according to claim 1 wherein the logical elements are NAND circuits.

3. The A/D conversion circuit according to claim 1 wherein the logical elements are NOR circuits.

4. The A/D conversion circuit according to claim 1 wherein the logical elements are fully differential delay circuits.

* * * * *